United States Patent [19]

Burton

[11] Patent Number: 4,521,764
[45] Date of Patent: Jun. 4, 1985

[54] SIGNAL-CONTROLLABLE ATTENUATOR EMPLOYING A DIGITAL-TO-ANALOG CONVERTER

[75] Inventor: David P. Burton, Limerick, Ireland

[73] Assignee: Analog Devices Incorporated, Norwood, Mass.

[21] Appl. No.: 336,288

[22] Filed: Dec. 31, 1981

Related U.S. Application Data

[63] Continuation of Ser. No. 43,174, May 29, 1979, abandoned.

[51] Int. Cl.³ .......................................... H03K 13/02
[52] U.S. Cl. .............................. 340/347 DA; 323/283; 323/354; 340/347 M
[58] Field of Search ................... 340/347 M, 347 DA; 367/65–67; 323/354, 283

[56] References Cited

U.S. PATENT DOCUMENTS

| | | | |
|---|---|---|---|
| 3,582,941 | 6/1971 | Le Maout et al. | 340/347 DA |
| 3,646,548 | 2/1972 | Van Doren | 340/347 AD |
| 4,021,772 | 5/1977 | Cook et al. | 179/15 BL |
| 4,021,800 | 5/1977 | Katagiri et al. | 340/347 M X |
| 4,048,635 | 9/1977 | Bich | 367/67 X |
| 4,099,174 | 7/1978 | Svensson | 340/347 DA |
| 4,232,302 | 11/1980 | Jagatich | 340/347 AD |

OTHER PUBLICATIONS

The Engineering Staff of Analog Devices, Inc., Analog–Digital Conversion Handbook, 6/1972, pp. I–60 to I–64; II–36 to II–41.

*Primary Examiner*—T. J. Sloyan
*Attorney, Agent, or Firm*—Parmelee, Bollinger, Bramblett & Drumm

[57] ABSTRACT

A signal-controllable attenuator comprising a 17-bit multiplying-type digital-to-analog converter having an R/2R ladder network to set the bit weights, and controlled by a 6-bit remotely-generated command signal to vary the attenuation in steps of 1.5 dB through a range of 88 dB. The 1.5 dB steps are controlled by a 4-bit code signal responsive to two bits of the command signal. The 4-bit code signal is directed to four successive bit input terminals of the converter. Which four DAC input terminals are selected is controlled by a shifting matrix which shifts the four bits along the DAC input terminals to a position determined by the other four bits of the command signal.

8 Claims, 3 Drawing Figures

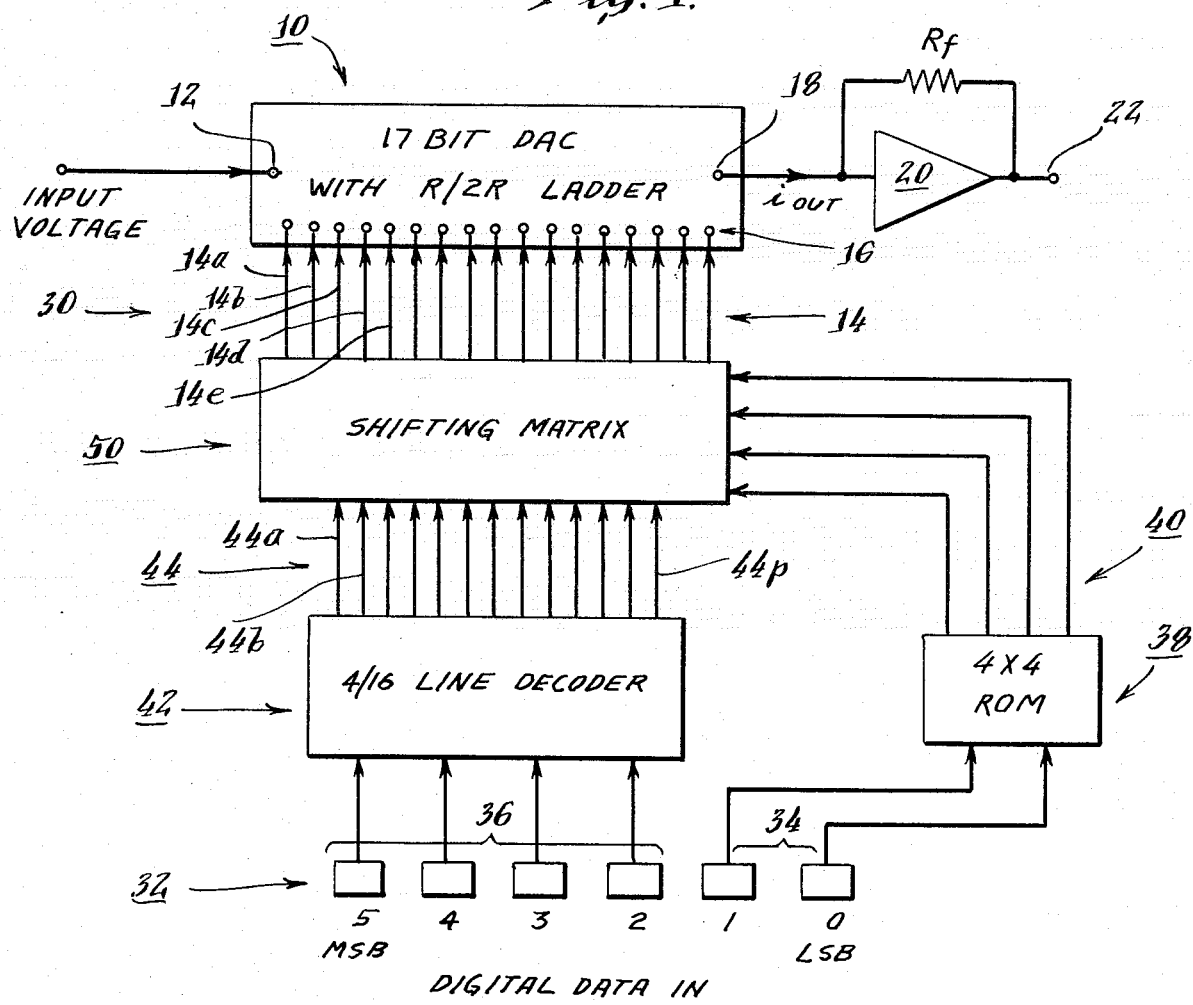

SIGNAL-CONTROLLABLE ATTENUATOR EMPLOYING A DIGITAL-TO-ANALOG CONVERTER

This is a continuation of application Ser. No. 43,174, filed May 29, 1979, abandoned.

BACKGROUND OF THE INVENTION

1. Field of the Invention

This invention relates to controllable-attenuation devices such as may be used to control the volume level of an audio signal. More particularly, this invention relates to variable-attenuation apparatus utilizing a digital-to-analog converter.

2. Description of the Prior Art

Variable attenuation devices have been used for many years in numerous applications. One common application is in the field of sound reproduction where it is desired to adjust the sound level to provide for preferred listening conditions. Such an adjustment can easily be effected by the use of a conventional potentiometer, as in the usual volume control. More recently, however, it has been desired to make such adjustments from a remote location, as by means of an electrical signal, and this result cannot be achieved economically by conventional volume-control apparatus.

It has been suggested that a digital-to-analog converter may be employed to adjust the level of an audio signal. Such a proposal is set forth in the article "Get Wide-Range Digitally Controlled Attenuation with a Companding D/A" by Walter Jung and Will Ritmanich, appearing in Electronic Design 23, for Nov. 8, 1978. That proposal however suffers from important disadvantages, particularly in requiring a relatively complex and therefore costly circuit arrangement.

SUMMARY OF THE INVENTION

In a preferred embodiment of the invention to be described hereinafter in detail, a signal-controlled attenuator is provided utilizing a multiplying digital-to-analog converter of the type having an R/2R ladder network. In such a network, the attenuation provided by any one stage differs from the attenuation of any adjacent stage by 6 dB (actually 6.0206 dB); that is, the shunt currents are in a ratio of 2:1 in successive legs of the ladder. Thus by turning on one stage at a time, in sequential progression, the attenuation presented by the ladder circuit can be varied in 6 dB steps.

Steps of 6 dB do not provide a sufficiently fine resolution for many applications, including that of attenuating an audio signal. To solve this problem, the digital to-analog attenuator to be described herein includes means for controlling a set of successive ladder stages of sufficient number to obtain the required resolution. In the present embodiment, the nominal design resolution is 1.5 dB per step. For that purpose, four successive stages are controlled by a 4-bit code signal having four different codes providing a variability of 0, 1.5, 3.0 and 4.5 dB. The next step to 6.0 dB is obtained by shifting the 4-bit code signal by one position (towards greater attenuation) to the next successive group of four ladder stages, and returning the 4-bit code to the original 0 dB code setting. Since the ladder network provides 6 dB per stage, a shift by one ladder position adds another 6 dB to whatever attenuation is developed by the 4-bit code. Thus, by returning the code to the 0 dB setting, the one-position shift will result in the desired net attenuation of 6 dB, as the next step beyond 4.5 dB.

Further steps in the progression are developed in comparable fashion, based on this principle. A practical device constructed in accordance with this invention, and employing a 17-bit digital-to-analog converter, provided a total attenuation range of 88.5 dB, in steps of 1.5 dB.

Accordingly, it is an object of this invention to provide improved signal-controllable attenuation apparatus. A more specific object of this invention is to provide such apparatus having superior performance specifications and which can be manufactured relatively economically. Other objects, aspects and advantages of the invention will in part be pointed out in, and in part apparent from, the following description considered together with the accompanying drawings.

BRIEF DESCRIPTION OF THE DRAWINGS

FIG. 1 is a block diagram of one embodiment of the invention; and

DESCRIPTION OF THE PREFERRED EMBODIMENT

Figure 2A:
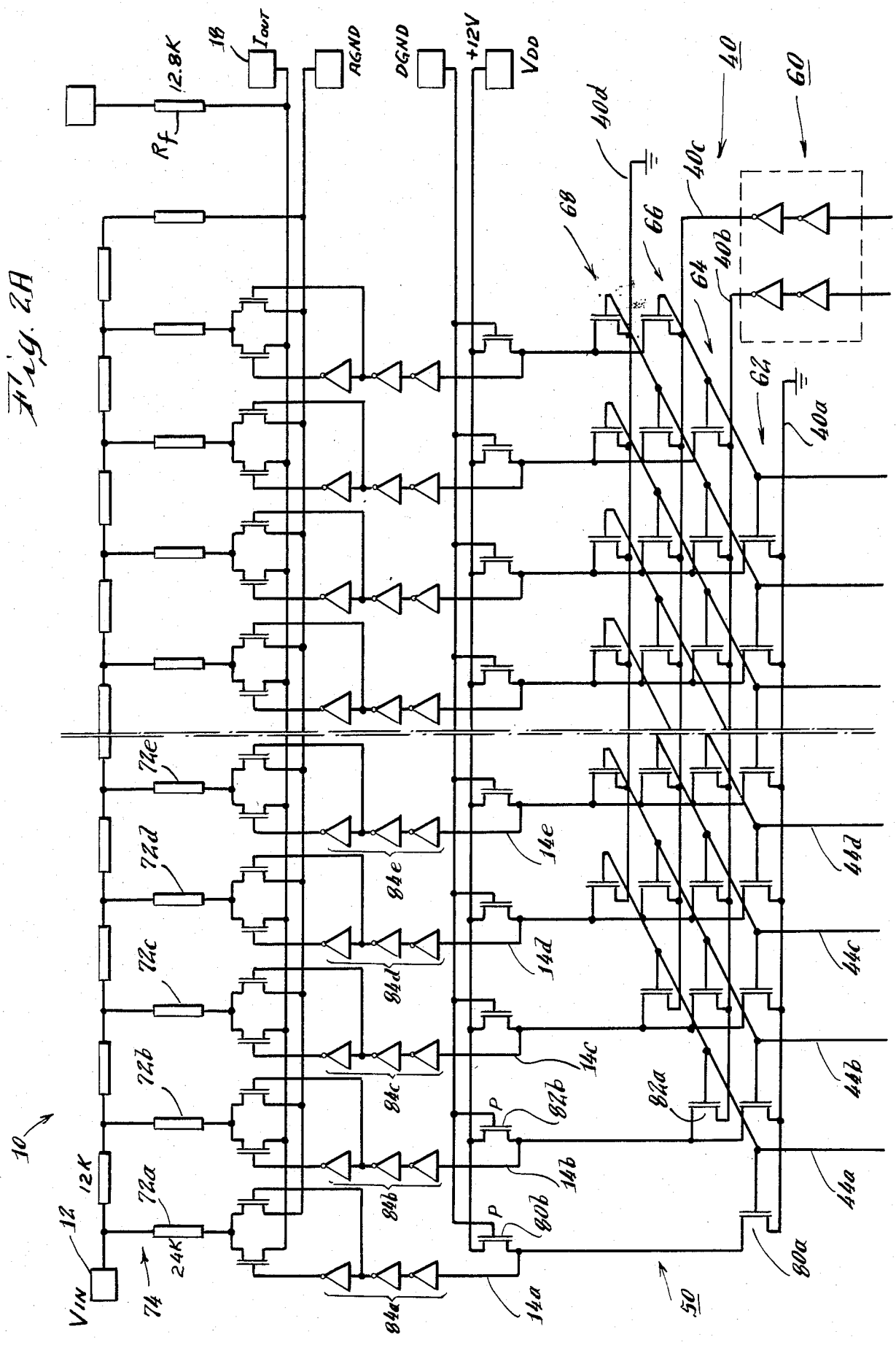
FIGS. 2A and 2B together present a detailed schematic of a preferred embodiment.

Referring now to FIG. 1, the apparatus shown in block outline comprises a conventional multi-stage multiplying digital-to-analog converter 10 (also called a "DAC") of the type utilizing an R/2R ladder network for setting the bit weights in binary progression. The input voltage to be attenuated is applied to the reference voltage terminal 12 of the DAC, and the digital input signal for controlling the attenuation is supplied by a set of digital lines 14 connected to respective switch control terminals 16. In the present embodiment, the DAC 10 has a 17-bit resolution, so there is a total of 17 digital lines 14.

A current output signal is developed from the DAC output terminal 18 in accordance with the logic pattern (i.e. zero's and one's) of the applied digital signal on the digital lines 14. This output current is directed to an operational amplifier 20 having a feedback resistor $R_f$ to produce a corresponding output voltage on the amplifier output terminal 22.

The remainder of the FIG. 1 circuitry comprises control apparatus, generally indicated at 30, for determining which of the digital input lines 14 for the DAC 10 will be activated in response to a 6-bit command signal applied to a set of six input terminals 32. Typically this command signal is developed remotely from the attenuator equipment. The 6-bit digital command signal comprises two separate signal groups having different functions. The first signal group 34 comprises the two least-significant bits (0, 1) of the 6-bit signal, and the second signal group 36 comprises the remaining four bits (Nos. 2-5).

The first signal group 34 of the 6-bit command signal is directed to the input of a code-developing circuit comprising (in the FIG. 1 arrangement) a known read-only-memory device (ROM) 38 arranged to produce on its output lines 40 a 4-bit code corresponding to the particular state of the two bits of the applied signal group 34. The second signal group 36 is directed to a conventional 4/16 line decoder 42 which activates one of its sixteen output lines 44 in accordance with the four-bit signal group 36.

The code lines 40 and the decoder output lines 44 are connected to and jointly control a shifting matrix generally indicated at 50. This device (details are shown in FIG. 2A) serves in known fashion to transfer the 4-bit code on the four lines 40 to four corresponding successive lines of the digital lines 14 for the DAC 10. Which set of four lines 14 is selected by the shifting matrix is determined by which of the decoder lines 44 is activated.

For example, if the left-most line 44a is activated, the 4-bit code from the ROM 38 is transferred to the four left-most digital lines 14a, 14b, 14c, 14d. If the next decoder line 44b is activated, the 4-bit code from the ROM is shifted to the right one step, and thus is applied to the next set of successive digital lines 14b, 14c, 14d, 14e. Accordingly, the 4-bit code signal is in effect directed through a four bit "window" opening on the 17 switch control terminals 16 of the DAC, with the window being positioned along the array of control terminals in conformance with the state of the 4-bit signal group 36.

In a simplified version of the attenuator of the present invention, the ROM 38 is replaced by a buffer/inverter circuit 60 (see FIGS. 2A, 2B) responsive to the two bits of the command signal group 34. The outer code lines 40a, 40d are maintained at ground potential for all codes. As shown in FIG. 2A, the four code lines are connected to respective sets of FET transmission gates 62, 64, 66, 68 which are activatable in groups of four by any of the sixteen decoder output lines 44a, 44b, etc. Each group of four gates, in turn, connects to four corresponding lines of the DAC digital lines 14 to supply the 4-bit code thereto when activated by the corresponding decoder lines 44a, etc.

In the particular arrangement disclosed herein, the four different 4-bit codes for controlling the inputs of the gates 62–68 were selected as follows:

| Step | Code | Attenuation (dB) |
| --- | --- | --- |
| 1. | 1111 | 0 |
| 2. | 1101 | 1.5 |
| 3. | 1011 | 3.0 |
| 4. | 1001 | 4.5 |

If the first code (1111) is directed to the left-most set of four digital lines 14a, 14b, 14c, 14d, the first four DAC switches 70a, 70b, 70c, 70d are closed. Thus, current flows from the input terminal 12 of the DAC, through the shunt elements 72a, 72b, 72c and 72d of the R/2R ladder 74, and out to the output terminal 18. Assuming an input voltage of 12 volts, and shunt resistors of 24K (with series resistors of 12K), the current through the first stage of the ladder will be 0.5 ma, and the currents through the three following successive stages will be 0.25, 0.125 and 0.0625 ma, in conformance with standard binary weighting. Thus the total output current will be 0.9375 ma. This current is directed to the operational amplifier 20 which, with a 12.8K feedback resistor $R_f$, will produce an output of 12 volts, corresponding to 0 dB attenuation.

The four 4-bit codes on the code lines 40 are designed to provide nominal attenuation steps of 1.5 dB. The fourth step in the cycle of these codes will produce a nominal attenuation of 4.5 dB. For the next step to 6 dB, the 4-bit code is returned to its original zero state (1111), and the complete set of code signal is shifted one position to the right, to close the switches for the next set of corresponding ladder switches 70b, 70c, 70d, 70e.

TABLE I

| Nominal Attenuation (dB) | 4-Bit Code | Shift Position of 4-Bit Code | Ladder Output Current | Output Vo/Vin | Actual Attenuation (dB) | Error from Nominal Att. (dB) |
| --- | --- | --- | --- | --- | --- | --- |
| 0 | 1111 | Left | .9375 | 1.00 | 0 | 0 |
| 1.5 | 1101 | " | .8125 | 0.866 | 1.243 | .257 |
| 3.0 | 1011 | " | .6875 | 0.733 | 2.694 | .306 |
| 4.5 | 1001 | " | .5625 | 0.60 | 4.437 | .063 |
| 6.0 | 1111 | 1-Right | .46875 | 0.5 | 6.021 | .021 |
| 7.5 | 1101 | " | .40625 | 0.433 | 7.264 | .236 |
| 9.0 | 1011 | " | .34375 | 0.367 | 8.716 | .284 |
| 10.5 | 1001 | " | .28125 | 0.300 | 10.458 | .042 |
| 12.0 | 1111 | 2-Right | .23437 | 0.240 | 12.041 | .041 |
| ... |  |  |  |  |  |  |
| ... |  |  |  |  |  |  |
| etc. |  |  |  |  |  |  |

For illustrative purposes, Table I sets forth the currents rents and output levels in detail for the first eight attenuation steps. It will be evident from these data that the attenuation steps are not precisely 1.5 dB each; however, as a practical matter attenuation of audio signals does not require high precision. If greater precision is needed, e.g. in other applications, additional resolution can be provided by the use of code signals with a greater range of variability, and/or by using a larger code signal (e.g. 5, 6 or 7 bits) for controlling more stages of the DAC with each set of code signals. An exemplary 5-bit code arrangement, adapted to be supplied by the ROM 38, is set forth below:

| Step | Code | Attenuation (dB) |
| --- | --- | --- |
| 1. | 11011 | 0 |
| 2. | 10111 | 1.5 |
| 3. | 10011 | 3.0 |
| 4. | 10000 | 4.5 |

Figure 2B:
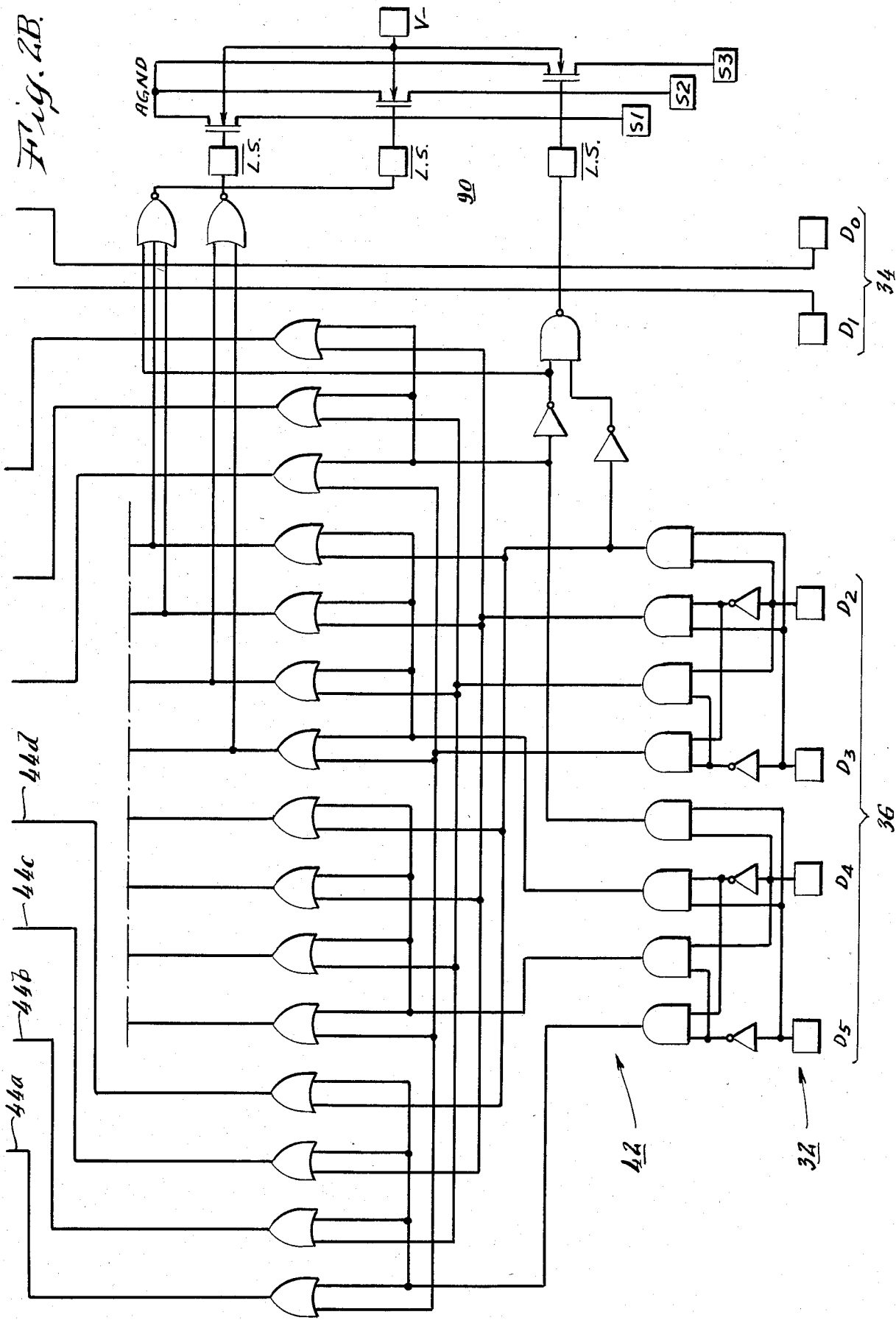

Further now with respect to the detailed circuit shown in FIGS. 2A and 2B, it will be seen from the diagram that the preferred embodiment is implemented using known CMOS technology. Thus the digital signal on any of the lines 44a, etc., is connected to one each of four pairs of series-connected devices 80a, 82a; 80b, 82b; etc., the common terminal between which develops a logic signal (zero or one) for the corresponding bit of the DAC 10. This logic signal is directed by the respective digital line 14a, 14b, etc., to a sequence of buffer/inverters 84a, 84b, etc., which in turn differentially drive the respective N-channel output switches 70a, 70b, etc. When the code bit on any of the code lines 40 is a "1", the corresponding switch 70 is conditioned to steer the bit current to the output terminal 18.

The line decoder 42 can be entirely of conventional design, utilizing known logic gate arrangements as shown in the circuit diagram. The disclosed apparatus further includes ancillary control devices in the form of circuitry generally indicated at 90 serving as loudness control switching for an audio application as described above, but such circuitry forms no part of the present invention.

Still other features can of course be provided to suit particular applications. For example, the command signal can be generated locally by an up/down counter device operable by clock pulses controlled from a remote location. Thus, the remote signal need provide only for "up" or "down" signals. The state of the command signal at any time can if desired be read out, for display or otherwise.

Accordingly, although a specific preferred embodiment of the invention has been set forth in detail, it is to be understood that this is for the purpose of illustrating the principles of the invention, and is not to be taken as necessarily limiting of the invention which is set forth in the accompanying claims.

I claim:

1. A digital-to-analog converter providing an attenuation factor varying in accordance with a logarithmic function, comprising:

a resistor network circuit having input and output terminals;

said resistor network circuit comprising a number N of successive stages of progressively differing attenuation values and each arranged to be connected into or out of the circuit to control the total attenuation between said input and output terminals;

said input terminal being connected to the attenuation stage at one end of said successive stages and said output terminal being connected to the attenuation stage at the other end of said successive stages;

means for applying an input signal to said input terminal;

switch means for each of said network stages, respectively, to provide for connecting the corresponding stage into or out of said resistor network circuit between said input and output terminals, to effect attenuation of said input signal in accordance with the selected stages which are switched in between said input and output terminals;

an array of N successive switch control terminals for said switch means respectively with each terminal arranged to receive a corresponding switch-control logic signal for operating the corresponding switch means;

means to receive a digital attenuation-controlling input signal comprising first and second groups of digital control signals;

logic-signal-generating means responsive to said first group of digital control signals and operable to develop a corresponding set of logic signals for defining an n-bit code where n is smaller than N; and shift-position-controlling means responsive to said second group of digital control signals for directing to an n-numbered sequential set of said switch-control terminals the respective individual binary signals of an n-bit code signal as defined by said set of logic signals, said n-numbered sequential set of switch-control terminals being selected from the total array of N successive switch-control terminals in accordance with said second group of digital control signals, said n-bit code signals being applied to said n-numbered set of switch-control terminals and controlling the on/off status of the corresponding n-numbered set of successive switch means to produce the level of attenuation commanded by said digital input signal;

the attenuation of said resistor network providing a transfer function which is a true logarithmic relationship to an accuracy determined by the number "n" preselected for the apparatus.

2. Apparatus as claimed in claim 1, wherein said resistor network comprises an R/2R ladder network with series and shunt elements providing a logarithmic variation of attenuation factor.

3. Apparatus as claimed in claim 2, wherein said switch means are arranged in series with shunt elements of said ladder network, to divert the shunt current either to the ladder output terminal or to a ground terminal;

said input terminal being connected to the common junction between the series and shunt resistors of said one end attenuation stage.

4. Apparatus as claimed in claim 3, wherein all of the switch means are held open except for said n-numbered set of successive switch means being controlled by said n-bit code signal.

5. Apparatus as claimed in claim 4, including an operational amplifier having its input connected to said network output terminal;

a feedback resistor for said amplifier and having a resistance value producing an output corresponding to zero attenuation when the n-bit code closes all n switch means of the set beginning with the highest order stage.

6. The method of setting the attenuation of an electrical signal comprising the steps of:

applying said electrical signal to the analog input of a multiplying digital-to-analog converter having a bit-weighting resistor network with N separate successive attenuation stages providing progressively differing attenuation values which are switch-controllable to be inserted into or out of the circuit between said input and an output terminal of said network;

said electrical signal being applied at the attenuation stage at one end of said successive stages;

controlling the switching of a particular group of n successive stages of said resistor network in accordance with a first multi-bit control signal, where n is smaller than N; and selecting said particular group of n successive stages from any of a number of different groups of n successive stages included within said N stages in accordance with a second multi-bit control signal, wherein at least two of said different groups have stages in common;

said resistor network providing an attenuation transfer function which is a true logarithmic relationship to an accuracy determined by the number "n".

7. The method of claim 6, wherein said first and second control signals form parts of a digital command signal.

8. The method of claim 7, wherein said first and second control signals are used to jointly control a shifting matrix to shift an n-bit code signal along the array of converter digital input terminals to a shift position determined by said second control signal.

* * * * *